United States Patent [19]
Crowley et al.

[11] Patent Number: 5,642,109
[45] Date of Patent: *Jun. 24, 1997

[54] FLEXIBLE INFLATABLE MULTI-CHAMBER SIGNAL GENERATOR

[76] Inventors: Robert J. Crowley, 64 Puritan La., Sudbury, Mass. 01776; Donald N. Halgren, 35 Central St., Manchester, Mass. 01944

[*] Notice: The term of this patent shall not extend beyond the expiration date of Pat. No. 5,459,461.

[21] Appl. No.: 581,316

[22] Filed: Dec. 29, 1995

Related U.S. Application Data

[63] Continuation-in-part of Ser. No. 447,117, Aug. 18, 1995, which is a continuation-in-part of Ser. No. 98,851, Jul. 29, 1993, Pat. No. 5,459,461.

[51] Int. Cl.$^6$ ........................................ H03K 17/94
[52] U.S. Cl. .................. 341/22; 273/374; 273/458; 340/323 R; 400/481; 400/491.1
[58] Field of Search .......................... 341/22, 21, 34; 340/323 R, 667, 665, 573, 544, 626, 825.19; 446/487, 408, 180, 176, 143; 273/371, 374, 377, 457, 458; 400/491.1, 481, 87

[56] References Cited

U.S. PATENT DOCUMENTS

| | | | |
|---|---|---|---|
| 3,729,197 | 4/1973 | Swanson et al. | 273/371 X |
| 4,017,848 | 4/1977 | Tannas, Jr. | 341/34 |
| 4,109,118 | 8/1978 | Kley | 200/5 E |
| 4,517,421 | 5/1985 | Margolin | 200/5 A X |
| 4,795,888 | 1/1989 | MacFarlane | 400/480 X |
| 4,833,457 | 5/1989 | Graebe, Jr. | 340/626 |
| 4,941,660 | 7/1990 | Winn et al. | 340/323 R X |
| 5,057,819 | 10/1991 | Valenti | 340/573 |
| 5,195,752 | 3/1993 | Reeves et al. | 273/374 |
| 5,212,473 | 5/1993 | Louis | 341/22 X |
| 5,459,461 | 10/1995 | Crowley et al. | 341/22 |

OTHER PUBLICATIONS

Cook et al., "Key Matrix Using a Fluid Medium", IBM Tech. Discl. Bull., vol. 13, No. 3, Aug. 1970.

*Primary Examiner*—Thomas Mullen
*Attorney, Agent, or Firm*—Don Halgren

[57] ABSTRACT

The present invention comprises a signal generator for sending an electrical signal upon receipt of an input force, the signal generator having a first outside layer of flexible, resilient plastic with a periphery and an inner surface, a second outside layer of flexible, resilient plastic having a periphery and an inner surface, the first and second layers joined at least at their periphery to form walls defining primary chamber. The primary chamber also has at least one inside layer of flexible, resilient plastic having a periphery and a first and second surface, the inside layer also being joined at its periphery, to the walls of the primary chamber to sub-divide the primary chamber into a plurality of adjacent sub-chambers. A pressurized fluid may be disposed in each of the sub-chambers and an electrical circuit may be arranged in at least one of the sub-chambers, to effectuate the transmission of an electrical signal from the primary chamber upon receipt of an input force within the primary chamber.

23 Claims, 2 Drawing Sheets

000000# FLEXIBLE INFLATABLE MULTI-CHAMBER SIGNAL GENERATOR

BACKGROUND OF THE INVENTION

1. Field of the Invention

This invention relates to signal generating devices, and more particularly to flexible, pressurizable, expandable signal generators which may be arranged for signal generation in business as well as for use in clothing and toys. This application is a Continuation-in-Part of U.S. patent application Ser. No. 08/447,117, filed Aug. 18, 1995, which is a Continuation-In-Part of U.S. patent application, Ser. No. 08/098,851 filed Jul. 29, 1993, now U.S. Pat. No. 5,459,461, each of which is incorporated herein by reference, in its entirety.

2. Introduction

Flexibility of signal generating devices has heretofore been limited to rigid panels linked by hinges to permit bending or conformance to another surface. Such devices have neither been collapsible nor deflatable to permit their reduction in size for storage or transport.

Such features are desirable if a signal generating device were to be made as a part of clothing, a uniform, a child's toy, a target or a game to be utilized when desired, or as a sensing device needed only at specific times, so as to be minimally obtrusive and not otherwise "in the way".

It is therefore an object of the present invention to provide a flexible, collapsible, signal generating device which can be expanded, by inflation, on demand, to permit signal generation for a variety of activities.

It is a further object of the present invention that such signal generating devices can permit force sensing by multiple sensor arrays.

BRIEF SUMMARY OF THE INVENTION

The present invention relates to a flexible, inflatable, readily conformable signal generating device having a preferred configuration of generally planar shape with a primary chamber defined by a plurality of generally parallel sheets of flexible material, joined at their peripheries to one another. Each pair of sheets within the primary chamber defines a sub-chamber all of which sheets, are flexible and distortable. Each sub-chamber of the primary chamber may be pressurizable independently of its adjacent chamber.

At least one side of one flexible sheet of each sub-chamber preferrably has a plurality of electrically conductive trace strips arranged thereon. Each conductive trace strip is connected to signal output conduit which extends through the wall of the primary chamber, to a further signal processing device.

Conductive trace strips may be arranged on opposed surfaces of the sheets which defines each sub-chamber. Alternatively, conductive trace strips may be on only one side of one sheet which defines a sub-chamber. Where trace strips are arranged on only one sheet defining a sub-chamber, such thin trace strips may preferably be comprised of a self-energizing material such as a piezoelectric material.

Each sub-chamber may be pressurized at increasingly higher pressures, from one side of the primary chamber to the other side thereof, or from an innermost chamber having a first pressure to an outermost chamber(s) having a different (higher/lower) pressure.

A first force or depression of an outer wall of the primary chamber may generate a signal by distorting one trace strip in a first sub-chamber, or by effecting contact between opposed adjacent trace strips on the flexible sheets defining the first sub-chamber.

A second force or depression which extends through the outer flexible wall and against an inner wall of the primary chamber may cause the creation of a further signal in both the first sub-chamber and a second (or more) subsequent, adjacent sub-chamber.

The primary chamber and the sub-chambers which define the primary chamber may be generally concentric spherical chambers, they may be generally co-axial cylindrical shaped sub-chambers defining a cylindrical shaped primary configuration, wherein each sub-chamber is laterally adjacent the other sub-chambers.

Each chamber may have target zones on their outermost walls. Each target zone may have its own trace conductor to establish its own respective signal where that target zone was flexed or distorted. Each target zone may also be comprised of a concave or convex wall portion, or of a depressible key formation. Each target zone may have a surface shape to limit distortion or flexing to the respective target zone to which a force is applied.

The primary chamber may be a device for children, such as a target or game for showing accuracy of thrown objects. The primary chamber may comprise a musical instrument in the form of a keyboard or the like. The strike zones would represent different targets/musical notes, which, upon striking with a sufficient predetermined force, would cause a specific electrical signal to be sent to a processing unit, for display on a monitor or as a generated sound from a loudspeaker. Multiple chambers would be utilized to play the sounds louder, upon deflection of adjacent sub-chambers.

The primary chamber may comprise portions of clothing to assist in force determination or location of hits at targets zones on that primary chamber, or for signal generating by manual input at target zones on the primary chamber.

The present invention thus comprises a signal generator for sending an electrical signal upon receipt of an input hit, the generator comprising a first outside layer of flexible, resilient plastic having a periphery and an inner surface, a second outside layer of flexible, resilient plastic having a periphery and an inner surface, the first and second layers joined at least at their periphery to form walls defining a primary chamber, an inside layer of flexible, resilient plastic having a periphery and a first and second surface, the inside layer joined at its periphery to the walls of the primary chamber to sub-divide the primary chamber into a plurality of adjacent sub-chambers, a pressurized fluid disposed in each of the sub-chambers, and an electrical signal completion means arranged in at least one of the sub-chambers, to effectuate the transmission of an electrical signal from the primary chamber upon receipt of an input hit at one of the sub-chambers. The signal generator has fluid in each of the adjacent sub-chambers which fluid is preferably at a different pressure in each sub-chamber.

The signal completion means comprises a flexible, distortable conductive trace attached to preferably at least one surface of each of the layers of flexible, resilient plastic material. The signal completion means includes an electrical conduit arranged to transmit electrical signals from the flexible traces through a conduit extending across the walls of primary chamber, to a further electrical processing device. The electrical conduit also preferably includes a pressure fluid lumen, for transmitting fluid under pressure from a pressure source to each of the sub-chambers. The primary chamber may be of generally planar configuration, having a plurality of generally overlapping sub-chambers. The primary chamber may also be of generally cylindrical configuration, having a plurality of co-axially disposed sub-chambers. The primary chamber may also be of generally spherical configuration, having a plurality of concentrically disposed sub-chambers disposed therewithin. The primary chamber preferably has a plurality of target zones thereon, for receipt of an input force or hit thereat.

At least one the sub-chambers has a layer of flexible material with a plurality of target zones therein. Each target zone may have a peripheral reinforcing lip disposed therearound, to limit flexure of the flexible layer receiving the input hit, to define the territorial limits of the target zone. The primary chamber may comprise a layer of clothing, such as a panel flexibly disposed onto the arm or sleeve of a jacket. The target zones may be letters or numbers of a signal generator, for inputting of alpha-numeric data into a processor/computer. The primary chamber may also comprise a device such as a toy for children's amusement. Such a device could be part of clothing and also could comprise a glove for a hand. A hand could be inserted onto a primary chamber, or between a pair of sub-chambers, to deflect certain target zones within those sub-chambers. The target zone on any primary or sub-chamber may also comprise a defined area for receiving a force or pressure against it, or it may be a formed depressible key for inputting data, or the target zone may comprise a formed dome for receipt of an input hit in a game.

The invention comprises a flexible, pressurizable body-adaptable device functioning as a signal generator, comprising: a plurality of layers of flexible material having common seams at which they are joined, to define individual pressurizable chambers between the layers of material; a fluid under pressure in at least one of the chambers; an electrical signal generating circuit arranged in at least one of the chambers to send an electrical signal from the chamber to a further electrical device for the presentation of information, wherein the signal generator is attached to and is part of the article of clothing. The body adaptable device may comprise an article of clothing such as a glove having a primary chamber therewithin, in which a hand may be inserted. The body adaptable device may comprise an article of clothing such as sleeve in which an arm may be inserted. The body adaptable device comprises a support on which a body may be disposed, movement of the body providing flexure of a chamber and signal creation within the signal generating device.

The invention also comprises a method of generating an electrical signal in an input target in response to a force applied to the input target, comprising the steps of: arranging a plurality of layers of flexible material adjacent one another; attaching a flexible circuit to at least one of the layers of flexible material, the flexible circuit being connectable to a further electrical device; securing the layers of flexible material together along a seam, so as to establish a flexible pressurizable chamber therebetween; pressurizing the flexible chamber made of the layers of flexible material attached to one another at a seam; and distorting a portion of at least one of the layers of flexible material, so as to create an electrical signal in the flexible circuit attached thereat; and sending the electrical signal created at the distorted portion of the electrical circuit through the flexible layers and to the further electrical device for input thereat. The input target may be an article of clothing to be worn on a human body, an article of support for a human body, or the input target may be a pressurizable flexible toy.

BRIEF DESCRIPTION OF THE DRAWINGS

The objects and advantages of the present invention will become more apparent when viewed in conjunction with the following drawings, in which.

DESCRIPTION OF THE PREFERRED EMBODIMENTS

Figure 1:
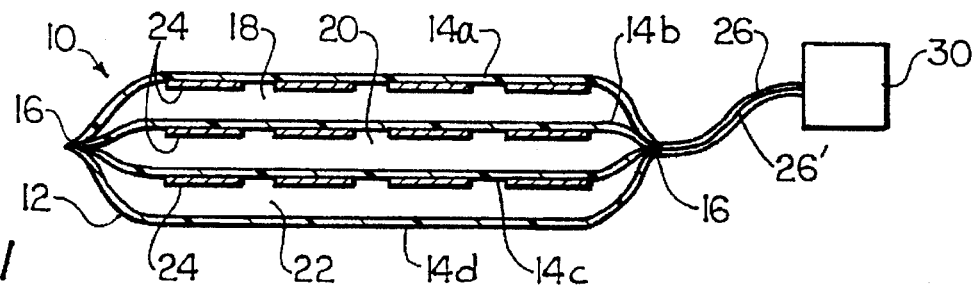
FIG. 1 is a side elevational view of the signal generation device, taken in section, showing multiple chambers therein.

The present invention relates to a flexible, inflatable and deflatable, readily conformable signal generating device 10 having a preferred configuration of generally planar shape with a primary chamber 12, as shown in FIG. 1, defined by a plurality of generally parallel sheets of flexible material 14a–d, joined at least at their peripheries 16 to one another. Each pair of sheets 14a and 14b, 14b and 14c, 14c and 14d, each defining a sub-chamber 18, 20 and 22, all of which are flexible and distortable. Each sub-chamber 18, 20 and 22, is pressurizable independently of its adjacent chamber, through a pressurizable fluid supply conduit 26, which may have a lumen (not shown for clarity), for each sub-chamber 18, 20 and 22. Each sub-chamber mat be divided into further smaller chambers, not shown, as by welding adjacent flexible layers together to make seams which defines such "smaller" chambers.

At least one side of one flexible sheet 14 a–d, of each sub-chamber 18, 20 and 22, may have a plurality of electrically conductive, thin, flexible, trace strips 24 such as piezoelectric material, metal or conductive polymers arranged thereon. Each conductive trace strip 24 is connected, through a proper circuit, not shown, to a signal output conduit 26', which may coincide with the fluid supply conduit 26, and which extends through the wall of the primary chamber 12, to a further signal processing device 30, such as a data processing unit, video monitor, memory storage unit or the like.

Conductive trace strips 24 may also be arranged on opposed (both) surfaces of the sheets 14a–14d, which opposed pairs of flexible sheets 14a–14d, defines each sub-chamber. Alternatively, conductive trace strips 24 may be on only one side of one sheet 14a–c, as shown in FIG. 1, which pairs still define the sub-chambers 18, 20 and 22. Where trace strips 24 are arranged on only one sheet defining a sub-chamber, such trace strips 24 may preferably be comprised of a self-energizing material such as the piezoelectric material. Such piezoelectric strips of material may also be utilized in this invention for its reverse effects, wherein electrical signals may be received into those strips (from a remote signal generator) attached on the flexible layers of the chamber(s) and mechanical vibrations or other movement thus generated therein, to alter and affect the flexible layer on which they are attached, so as to act as reverse sensors or sensors which are remote from such further signal generator. Each sub-chamber 18, 20 and 22 may be independently pressurized at increasingly higher pressures, (i.e. sub-chamber 18 at 10 psi, sub-chamber 20 at 15 psi and sub-chamber 22 pressurized at 20 psi), from one side of the primary chamber 12 to the other side thereof.

A first force depressing an outer wall of the primary chamber 12, may be accomplished by a tactile push by a finger, a hit by a toy ball or thrown missile. The force may generate a signal by distorting part of the internal circuit such as a first single (piezoelectric) trace strip 24 in a first sub-chamber (i.e. sub-chamber 18), or by effecting contact between opposed adjacent trace strips 24 on the flexible adjacent sheets 14a and 14b defining the first sub-chamber 18, when a second trace strip (not shown) is disposed on the sheet 14b facing sheet 14a. Thus, the chamber 12 shown in FIG. 1 may be used as a signal generating toy target or the like.

A second (greater) force or depression which extends through the outer flexible wall and also against an inner wall 14b and/or 14c of the primary chamber 12, may cause the creation of a further (or stronger) signal in both the first sub-chamber 18 and a second (or more) subsequent, adjacent sub-chamber 20 and 22.

Figure 2:
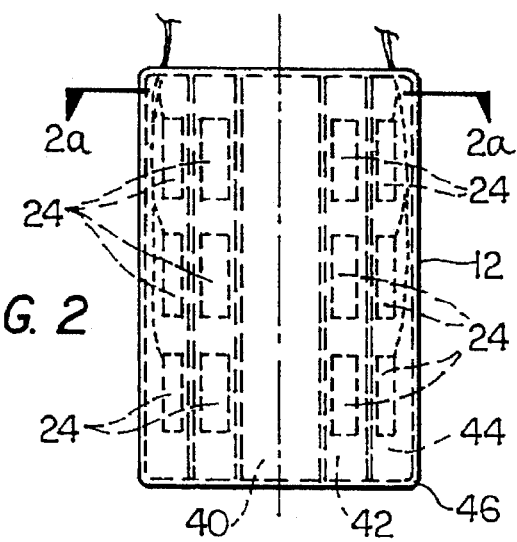
FIG. 2 is a side elevational view of a further embodiment of the present invention, in a cylindrically shaped configuration.
Figure 2A:
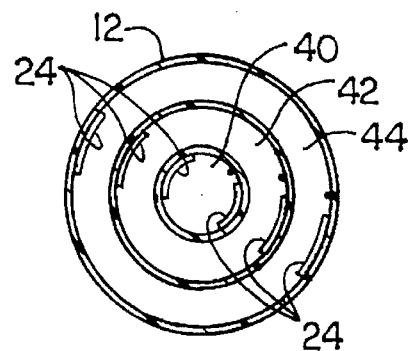
FIG. 2a is a view taken along the lines 2a—2a of FIG. 2.
Figure 3:
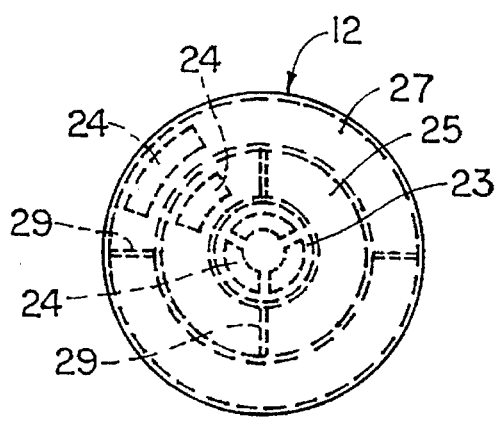
FIG. 3 is a perspective view of yet a further embodiment of the present invention, in a spherically shaped configuration.

The primary chamber 12 and the sub-chambers 18, 20 and 22 which define the primary chamber 12 may in a further embodiment, be arranged in generally concentric spherical chambers 23, 25 and 27, connected by a support web 29, as shown in FIG. 3, or they may be disposed in generally co-axial, cylindrically shaped sub-chambers 40, 42 and 44, as shown in FIGS. 2 and 2a, joined at their longitudinal ends, and each defining a cylindrically shaped primary configuration 46, wherein each sub-chamber 40, 42 and 44 is generally radially adjacent the other sub-chambers. Such chambers may be utilized as part of a toy, a bat and ball arrangement, or the like.

Figure 4:
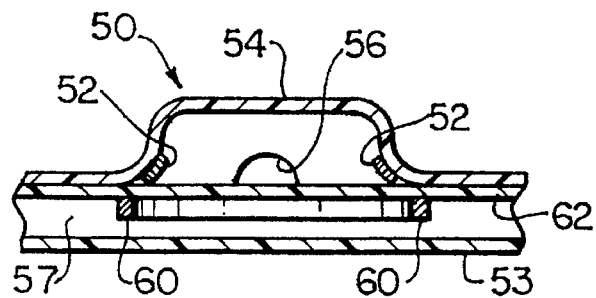
FIG. 4 is a side elevational view of a target zone in a multi-layer chamber constructed according to the principles of the present invention.

Each chamber in any embodiment, may have at least one area as a target zone 50 on a wall 62, as shown in FIG. 4. Each target zone 50 may also be a smaller chamber as aforementioned, or may be distributed as a collective group upon a layer of flexible material of a sub-chamber and would have its own trace conductor(s) 52 to establish its own respective signal where that target zone 50 was flexed or distorted, and may be adjacent another layer of thin, flexible plastic sheet material 53, which between them, may define a sub-chamber 57 having a pressure different from that chamber immediately adjacent its outer wall 54. Each target zone 50 may be its own small individually pressurized chamber or it may be shaped as a concave or convex wall portion 54, or it may be shaped like a depressible typewriter key as part of an array of such zones 50 on a (larger) sub-chamber communicatively connected by a conduit 56.

Each target zone 50 may have a surface supporting ring or peripheral support element 60, as shown in an edge view in FIG. 4, to limit distortion or flexing to only the respective target zone 50 to which a force is applied, by acting as a flexure barrier and a reinforcement to the surrounding flexible layer.

Figure 5:
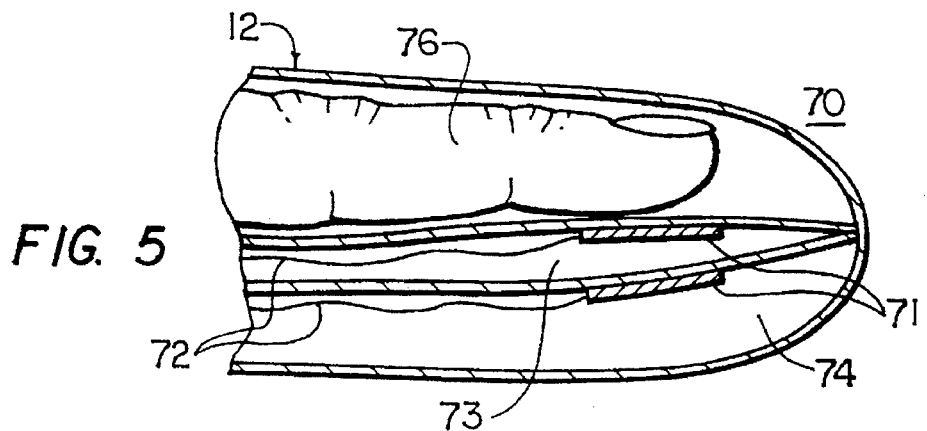
FIG. 5 is a side elevational view, partly in section, showing the present invention, as part of a multi-chamber glove.

The primary chamber 12 may be a device for children, such as a multi-pressurized layered or a multi-chambered doll/toy animal having areas which respond to touch or pressure, or a target or game having a plurality of target zones as the goal of a "hit", for showing accuracy of thrown balls or other missiles or objects, or the chamber may be a musical keyboard for the playing of musical notes defined by subchambers or by individual traces of circuitry, for the sending of appropriate signals to a signal processor, depending upon the particular areas/target keys pressed, and with what force they are pressed. Those "target" areas/keys then send the signals to a processor, for subsequent emission as a sound, a light, a score or music from a loudspeaker. A glove 70, is shown in FIG. 5, for sending signals from a circuit 71, connected by wires 72, from one or more sub-chambers 73 and 74, depending upon the force/pressure applied to or received by/into/against a finger or receiving member 76 therewithin.

Figure 6:
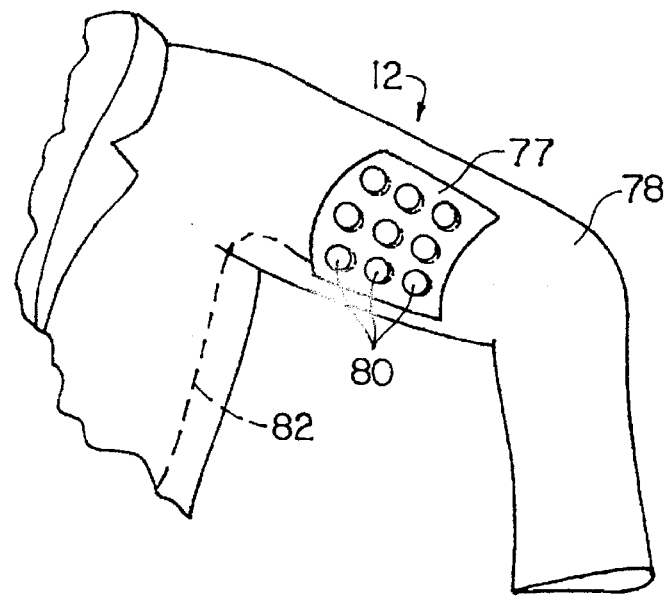
FIG. 6 is a perspective view of primary chamber as part of a piece of clothing, showing target zones thereon.
Figure 7:
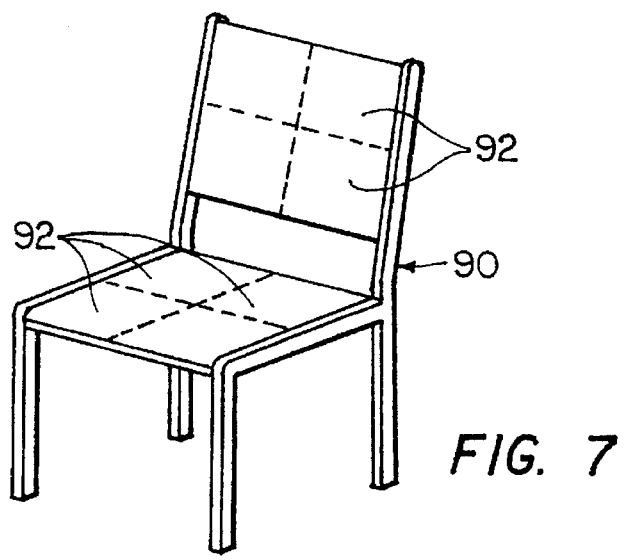
FIG. 7 is a perspective view of a body support device having multiple pressurizable chambers thereon.

The primary chamber 12 may also comprise a flexible, inflatable, preferably multi-layer signal generator 77, as a portion of clothing 78, as shown in FIG. 6, (which may also be very "form fitting"), to assist in force determination or sensing the location of touching, rubbing or hits that a body was taking, or for signal generation on an area such as a sleeve of a uniform, by manual input at target zones 80, for example, for the taking of inventory or the like, where the signal generator 77 would send signals through an internal circuit 82, to a further processor/memory device elsewhere on the person wearing the device. A primary chamber may also be placed upon a body support fixture such as a chair seat 90, such as shown in FIG. 7, having a plurality of adjacent (or overlapping) individually pressurized chambers 92, each of which are arranged to send electric signals to an electrical signal processor (not shown), upon movement of a body portion with respect to such chambers 92. The body support device may also be a bed, or the primary chamber may be comprised of an entire assembly of clothing, not shown. Body movement, expansion or pressure would flex individual "small" or sub-chambers, whether those chambers were side by side or in overlapping layers, or both. The signal created in those respective chambers would generate an X–Y signal to move a cursor, position an aiming device, steer a vehicle or operate a video game.

Thus, what has been shown is a unique arrangement for sending electrical signals from, or receiving an electrical signals into a flexible, distortable, pressurizable, collective array of individual chambers, which chambers may be part of a keyboard, a part of a toy doll or animal, a game, an article of clothing, target or body support device, each chamber having means for receiving or sending one or more electrical signals via a proper circuit connected thereto.

We claim:

1. A signal generator for sending an electrical signal upon receipt of an input force, said generator comprising:

a first outside layer of flexible, resilient material having a periphery and an inner surface;

a second outside layer of flexible, resilient material having a periphery and an inner surface; said first and second layers joined to define a primary pressurizable chamber;

said primary chamber is divided into a plurality of pressurized sub-chambers;

a pressurized fluid disposed in at least one of said pressurized sub-chambers; and an electrical signal completion means arranged in said at least one of said sub-chambers, to effectuate the transmission of an electrical signal upon receipt of an input force at said sub-chamber.

2. The signal generator as recited in claim 1, wherein each of said sub-chambers is pressurized at a different pressure.

3. The signal generator as recited in claim 1, wherein said signal completion means comprises a flexible distortable conductive component attached to at least one surface of said layers of flexible material.

4. The signal generator as recited in claim 3, wherein said signal completion means includes an electrical conduit arranged to transmit electrical signals from said conductive component, through said walls of said primary chamber, to a further electrical device.

5. The signal generator as recited in claim 4, wherein said electrical conduit also includes a pressure fluid conduit, for transmitting fluid under pressure from a pressure source to said sub-chambers.

6. The signal generator as recited in claim 5, wherein said primary chamber comprises a portion of a layer of clothing.

7. The signal generator as recited in claim 5, wherein said primary chamber comprises a signal generating toy device for children's amusement.

8. The signal generator as recited in claim 5, wherein said primary chamber comprises a glove for a hand, said glove having a force sensing electrical circuit therein for creating a signal to be sent to a further circuit, upon the delivery of a force to said glove, said force being sensed by said force sensing electrical circuit.

9. The signal generator as recited in claim 1, wherein said primary chamber has a plurality of defined target zones thereon, for receipt of an input force thereat.

10. The signal generator as recited in claim 9, wherein at least one of said sub-chambers has a layer of flexible material with at least one target zone thereon.

11. The signal generator as recited in claim 10, wherein said at least one target zone has a peripheral reinforcing lip disposed therearound, to limit signal generating flexure of said flexible layer receiving the input force to said defined target zone.

12. The signal generator as recited in claim 9, wherein said target zone comprises a formed depressible key for inputting data.

13. The signal generator as recited in claim 9, wherein said target zone comprises a formed dome for receipt of an input force in a game.

14. The signal generator as recited in claim 1, wherein said primary chamber is of generally planar configuration, having a plurality of overlapping sub-chambers.

15. The signal generator as recited in claim 1, wherein said primary chamber is of generally cylindrical configuration, having a plurality of co-axially disposed sub-chambers.

16. The signal generator as recited in claim 1, wherein said primary chamber is of generally spherical configuration, having a plurality of concentrically disposed sub-chambers disposed therewithin.

17. A flexible, pressurizable body fitting article functioning as a signal generator, comprising:

a plurality of layers of flexible material, joined to define individual pressurizable chambers between said layers of material;

a fluid under pressure in at least one of said chambers; and an electrical signal generating circuit arranged in at least one of said chambers to send an electrical signal from said chamber upon the sensing of a force by said generating circuit, to a further electrical device for the input of information via the electrical signal, wherein said signal generating circuit is attached to and is part of said body fitting article.

18. The signal generator as recited in claim 17, wherein said body fitting article comprises an article of clothing selected from the group comprised of: a glove having a primary chamber therewithin, in which a hand may be inserted, and a jacket sleeve in which an arm may be inserted.

19. The signal generator as recited in claim 17, wherein said body fitting article comprises a support on which a body may be disposed, movement of the body providing flexure of a chamber and signal creation within said signal generating device.

20. A method of generating an electrical signal in a specific area of a flexible signal generator in response to a force applied to said signal generator, comprising the steps of:

arranging a plurality of layers of flexible material adjacent one another;

attaching a flexible circuit to at least one of said layers of flexible material, said flexible circuit being connectable to a further electrical device;

securing said layers of flexible material together so as to establish a flexible pressurizable chamber therebetween;

pressurizing said flexible chamber made of said layers of flexible material attached to one another;

distorting a portion of at least one of said layers of flexible material, so as to create an electrical signal in said flexible circuit attached thereat; and sending said electrical signal created at said distorted portion of said electrical circuit through said flexible layers and to the further electrical device for input and use of such signal thereat.

21. The method of claim 20, wherein said flexible signal generator is an article of clothing to be worn on a human body.

22. The method of claim 20, wherein said flexible signal generator is an article of support for a human body.

23. The method of claim 20, wherein said flexible signal generator is a pressurizable flexible toy.

* * * * *